(12) United States Patent
Chang et al.

(10) Patent No.: US 9,611,548 B2
(45) Date of Patent: Apr. 4, 2017

(54) WAFER ROTATING APPARATUS

(71) Applicant: GlobalWafers Co., Ltd., Hsinchu (TW)

(72) Inventors: Yuan-Hao Chang, Hsinchu (TW); Te-Hao Lee, Hsinchu (TW); Ying-Ru Shih, Hsinchu (TW); Wen-Ching Hsu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 15/076,684

(22) Filed: Mar. 22, 2016

(65) Prior Publication Data

US 2016/0322244 A1    Nov. 3, 2016

(30) Foreign Application Priority Data

Apr. 30, 2015  (TW) .............................. 104113930 A

(51) Int. Cl.
| | |
|---|---|
| *C23C 18/16* | (2006.01) |
| *H01L 21/67* | (2006.01) |
| *H01L 21/673* | (2006.01) |
| *H01L 21/68* | (2006.01) |

(52) U.S. Cl.
CPC ...... *C23C 18/163* (2013.01); *H01L 21/67057* (2013.01); *H01L 21/67326* (2013.01); *H01L 21/68* (2013.01)

(58) Field of Classification Search
CPC ............. C23C 18/163; H01L 21/67057; H01L 21/67326; H01L 21/68; B25B 5/06; B23Q 3/06; B23Q 1/5468
USPC ......... 269/305, 289 MR; 254/418, 424, 103, 254/134
See application file for complete search history.

(56) References Cited

U.S. PATENT DOCUMENTS

| | | | |
|---|---|---|---|
| 3,798,056 A * | 3/1974 | Okinaka .............. | C23C 18/163 118/409 |
| 4,662,811 A * | 5/1987 | Hayden .................. | H01L 21/68 198/394 |
| 4,813,840 A | 3/1989 | Prabhakar et al. | |

(Continued)

FOREIGN PATENT DOCUMENTS

| | | |
|---|---|---|
| CN | 2632848 | 8/2004 |
| CN | 201374316 | 12/2009 |

(Continued)

OTHER PUBLICATIONS

"Office Action of Taiwan Counterpart Application", issued on Jul. 11, 2016, p. 1-p. 6.

*Primary Examiner* — George Nguyen

(74) *Attorney, Agent, or Firm* — Jianq Chyun IP Office

(57) ABSTRACT

A wafer rotating apparatus includes a base, a carrying device, a first shaft gear, a power unit, a roller, a second shaft gear and a driving assembly. The base has an accommodating space which the carrying device is disposed in to accommodate the wafer. The first shaft gear is disposed on a side surface of the base. The power unit is assembled to a top of the base and connected to the first shaft gear. The roller is located under the carrying device and supports an edge of the wafer. The second shaft gear is disposed on the side surface of the base and connected to the roller. The driving assembly is connected between the first shaft gear and the second shaft gear. The power unit provides a power through the first gear, the driving unit and the second shaft gear to drive the roller to rotate the wafer.

15 Claims, 9 Drawing Sheets

(56) References Cited

U.S. PATENT DOCUMENTS

| | | | | |
|---|---|---|---|---|
| 5,149,158 | A * | 9/1992 | Molinaro | H01L 21/68707 118/500 |
| 5,352,249 | A * | 10/1994 | Vollaro | H01L 21/68 269/305 |
| 5,507,614 | A * | 4/1996 | Leonov | H01L 21/67775 414/768 |
| 5,520,205 | A * | 5/1996 | Guldi | H01L 21/67051 134/102.1 |
| 5,533,243 | A * | 7/1996 | Asano | H01L 21/68 269/289 MR |
| 5,551,829 | A * | 9/1996 | Jerolimov | H01L 21/68 198/394 |
| 5,759,007 | A | 6/1998 | Nichols et al. | |
| 5,816,274 | A * | 10/1998 | Bartram | B08B 3/10 134/140 |
| 5,908,042 | A * | 6/1999 | Fukunaga | B08B 11/02 134/25.1 |
| 6,273,107 | B1 * | 8/2001 | Adams | B08B 3/102 134/102.1 |
| 6,532,976 | B1 * | 3/2003 | Huh | B08B 3/102 134/111 |
| 8,201,814 | B2 * | 6/2012 | Dopping | B28D 5/0082 269/289 MR |
| 2002/0066472 | A1 * | 6/2002 | Sonoda | H01L 21/67057 134/32 |
| 2002/0195133 | A1 * | 12/2002 | Miranda | B08B 3/12 134/186 |
| 2003/0106575 | A1 * | 6/2003 | Moon | H01L 21/67057 134/201 |
| 2004/0226506 | A1 * | 11/2004 | Lynn | H01L 21/67057 118/500 |
| 2004/0247424 | A1 * | 12/2004 | Blattner | H01L 21/68 414/754 |
| 2009/0120466 | A1 * | 5/2009 | Eshima | H01L 21/67057 134/36 |
| 2009/0159100 | A1 * | 6/2009 | Frey | B08B 3/12 134/33 |
| 2010/0078867 | A1 * | 4/2010 | Nakashima | H01L 21/67313 269/303 |

FOREIGN PATENT DOCUMENTS

| | | |
|---|---|---|
| JP | H11354597 A | 12/1999 |
| TW | 504041 B | 9/2002 |
| TW | 561542 B | 11/2003 |
| TW | 200608486 A | 3/2006 |
| TW | 201022091 A | 6/2010 |
| TW | M505691 U | 7/2015 |

* cited by examiner

WAFER ROTATING APPARATUS

CROSS-REFERENCE TO RELATED APPLICATION

This application claims the priority benefit of Taiwan application serial no. 104113930, filed on Apr. 30, 2015. The entirety of the above-mentioned patent application is hereby incorporated by reference herein and made a part of this specification.

BACKGROUND

Field of the Invention

The invention is directed to an apparatus and more particularly, to a wafer rotating apparatus applied in a wafer processing equipment.

Description of Related Art

A manufacturing process of integrated circuit (IC) devices includes wafer cleaning and wafer electroless plating processes. The wafer cleaning process is employed to remove organic compounds, metallic impurities or particles attached to surfaces of a wafer to prevent these pollutants from dramatically affecting subsequent processes (e.g., leakage occurring on p-n contacts, reduction in lifetime of a small number of carriers, reduction in a breakdown voltage of a gate oxide layer, or even a short circuit of a circuit structure). Additionally, in the wafer electroless plating process, metal ions (e.g., of nickel or gold) in a solution to be plated are deoxidized from the solution by means of an autocatalytic reaction and deposited on the wafer, such that the wafer surfaces can have plating layers with weldability or oxidation resistance.

However, in the wafer cleaning equipment, the wafer may be, for example, a wafer with a flat edge and may probably be shielded by elements (e.g., a cassette) of the wafer cleaning equipment, and as a result, the wafer is unevenly dipped in a cleaning fluid, which causes bad appearance and a poor yield rate to the wafer. Additionally, in the wafer electroless plating process, if hydrogen generated during the autocatalytic reaction is not quickly removed from the wafer surfaces, the plating fluid to be used cannot be sufficiently attached to the wafer surfaces, which causes unevenness to the plated layer and reduction in the yield of the wafer.

SUMMARY

The invention provides a wafer rotating apparatus applicable to a processing equipment for wafer cleaning and wafer electroless plating to improve the wafer yield.

A wafer rotating apparatus applied in a wafer processing equipment is provided. The wafer rotating apparatus includes a base, a carrying device, a first shaft gear, a power unit, a roller, a second shaft gear and a driving assembly. The base has an accommodating space. The carrying device is disposed in the accommodating space and used to contain a wafer. The first shaft gear is disposed on a side surface of the base. The power unit is assembled to a top of the base, where the first shaft gear is connected with the power unit. The roller is located under the carrying device and supports an edge of the wafer. The second shaft gear is disposed on the side surface of the base and connected to the roller. The driving assembly is connected between the first shaft gear and the second shaft gear. When the power unit provides a power to enable the first shaft gear and the driving assembly to rotate, the second shaft gear rotates to drive the roller to rotate, so as to rotate the wafer.

In an embodiment of the invention, the roller has a wrapping layer wrapping around the roller to increase friction between the roller and the edge of the wafer.

In an embodiment of the invention, a material of the wrapping layer is rubber.

In an embodiment of the invention, a material of the wrapping layer is marprene.

In an embodiment of the invention, the base further has a fixing portion. The fixing portion is disposed in the accommodating space and includes a plurality of limiting walls and a limiting slot between each two adjacent limiting walls, and the limiting slots connect with the accommodating space. Opposite sides of a bottom of the carrying device are disposed in the limiting slots to limit the carrying device from moving. A height of a top surface of each limiting wall is lower than a height of a rotation center of the roller.

In an embodiment of the invention, the base further has a fixing portion. The fixing portion is disposed in the accommodating space and includes a plurality of limiting walls and a limiting slot between each two adjacent limiting walls. The limiting slots are recessed from the top surfaces of the limiting walls to form a plurality of floors. Each floor has a plurality of through holes connecting with the accommodating space and the limiting slots. Opposite sides of the bottom of the carrying device are disposed in the limiting slots and contact the floors to limit the carrying device from moving. A height of a top surface of each of the limiting walls is lower than a height of a rotation center of the roller.

In an embodiment of the invention, the driving assembly is gear chain set. The gear chain set includes a plurality of gears, and the gears are engaged between the first shaft gear and the second shaft gear.

In an embodiment of the invention, the driving assembly is a belt. The belt surrounds the first shaft gear and the second shaft gear.

In an embodiment of the invention, the base further has a handheld portion. The base is movably disposed in the wafer processing equipment through the handheld portion.

In an embodiment of the invention, the handheld portion has at least a pair of cantilevers, and the cantilevers respectively protrude toward the outsides of the base.

In an embodiment of the invention, the handheld portion has two first frames and a second frame. The two first frames are respectively disposed on the side surface and another side surface of the base, and the second frame is vertically connected between the two first frames.

In an embodiment of the invention, the power unit includes a motor and a power supply device. The motor is connected with the first shaft gear. The power supply device is electrically connected with and drives the motor to drive the first shaft gear to rotate.

In an embodiment of the invention, the wafer rotating apparatus further includes a limiting pillar disposed on another side surface of the base. The limiting pillar protrudes from the another side surface of the base into the accommodating space and located above the top of the carrying device to limit the carrying device from wobbling.

In an embodiment of the invention, a material of the roller is polyaryletherketone (PEEK).

To sum up, in the wafer rotating apparatus of the invention, the edge of the wafer is supported by the roller, and thus, when the power unit drives the first shaft gear, the driving assembly and the second shaft gear to rotate, the roller drives the wafer to rotate. Therefore, in the wafer rotating apparatus of the invention either applied in a wafer cleaning equipment or a wafer electroless plating equipment, the surface of the wafer can be evenly dipped in a cleaning fluid, or no gas remains on a wafer surface. Thereby, the wafer yield can be enhanced.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1:
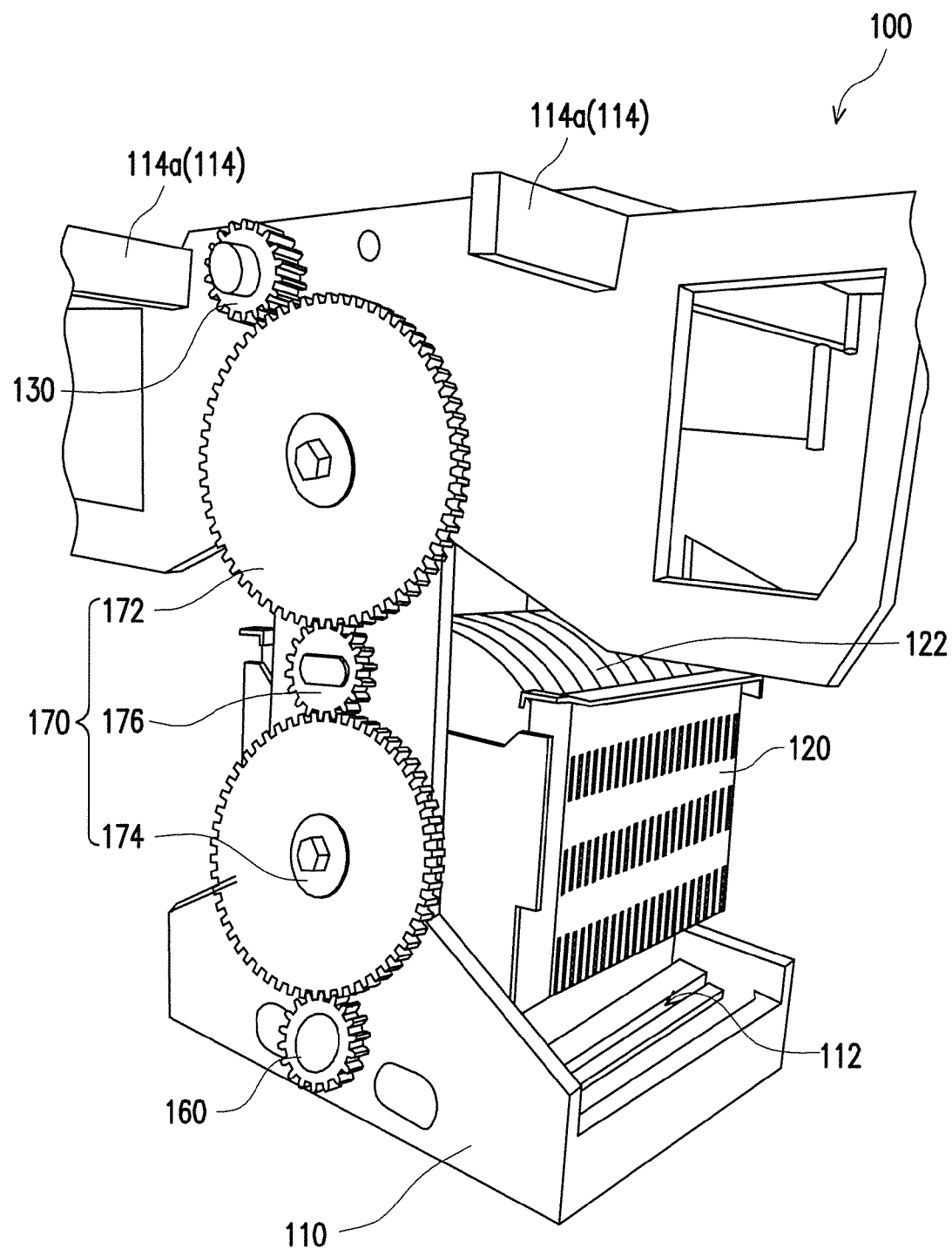
FIG. 1 is a perspective view illustrating a wafer rotating apparatus according to an embodiment of the invention.
Figure 2:
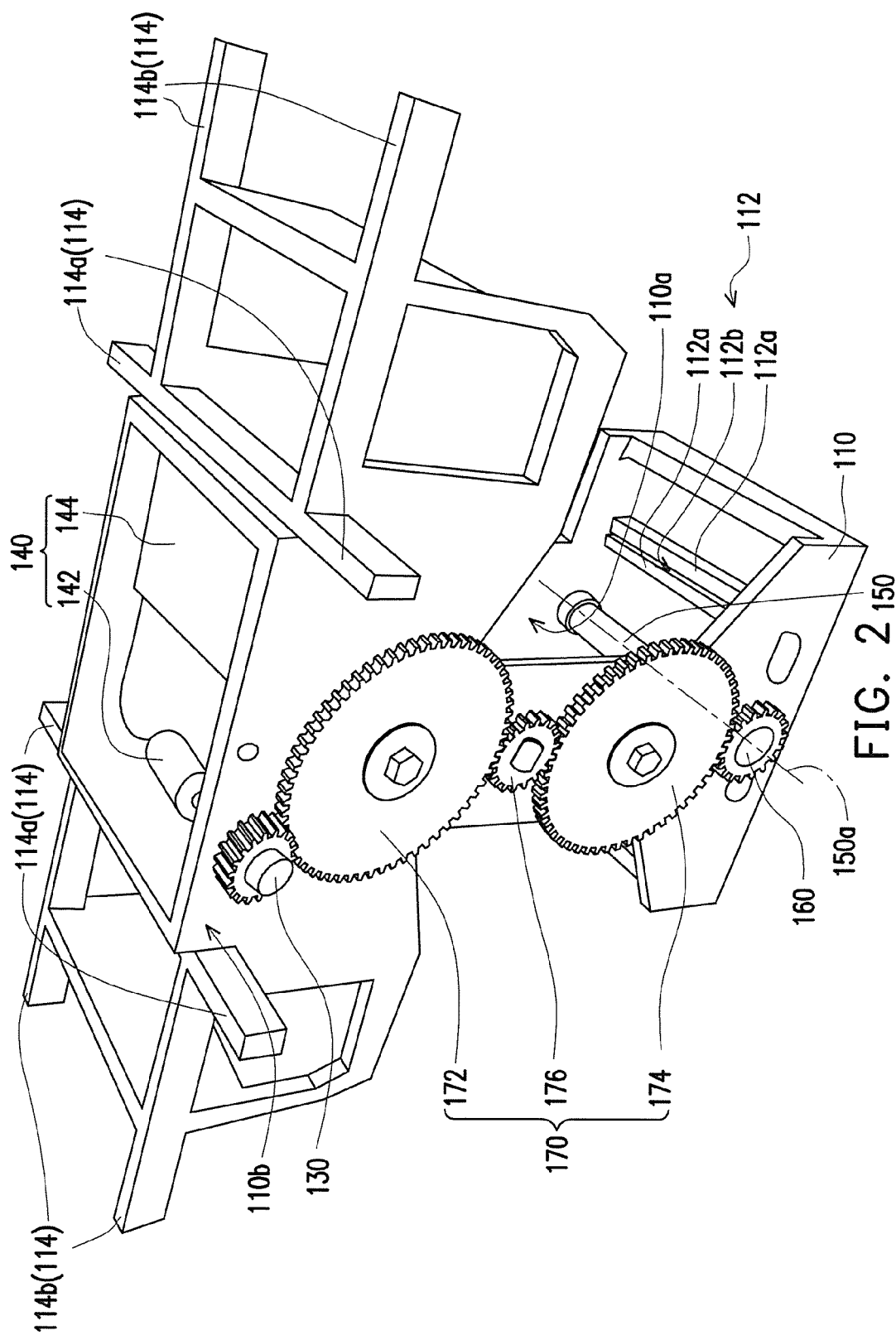
FIG. 2 is a perspective view of the wafer rotating apparatus depicted in FIG. 1 after the carrying device is removed.
Figure 3:
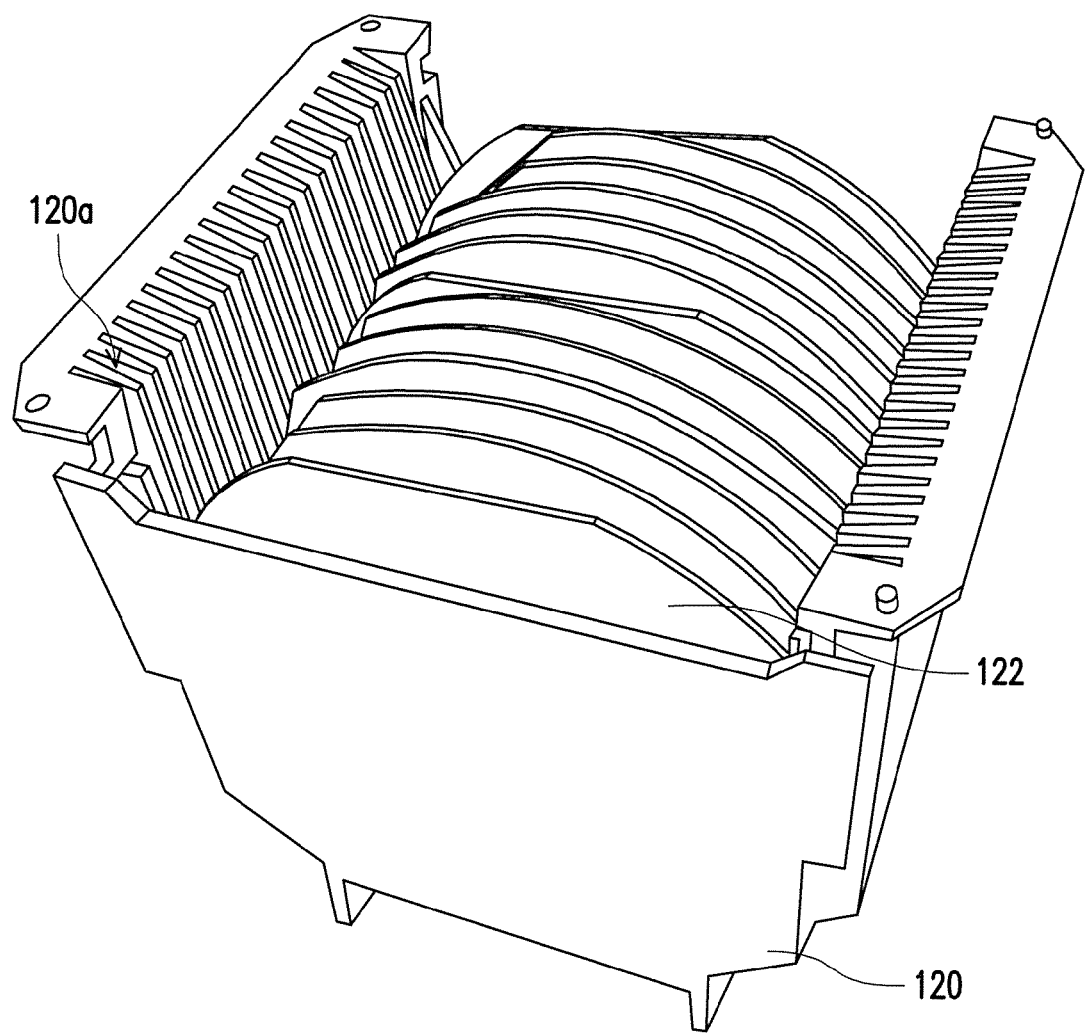
FIG. 3 is a perspective view of the carrying device depicted in FIG. 1.

FIG. 1 is a perspective view illustrating a wafer rotating apparatus according to an embodiment of the invention. FIG. 2 is a perspective view of the wafer rotating apparatus depicted in FIG. 1 after the carrying device is removed. FIG. 3 is a perspective view of the carrying device depicted in FIG. 1. In the present embodiment, a wafer rotating apparatus 100 is applicable to processing equipment (not shown) for wafer cleaning or wafer electroless plating to improve a yield rate of a wafer 122 processed by the processing equipment. The wafer rotating apparatus 100 includes a base 110, a carrying device 120, a first shaft gear 130, a power unit 140, a roller 150, a second shaft gear 160 and a driving assembly 170. The base 110 has an accommodating space 110a. The carrying device 120 is disposed in the accommodating space 110 and has a plurality of slots 120a to contain the wafer 122. In addition, the wafer 122 of the present embodiment may be a wafer with or without a flat edge, and the wafer 122 is described as a wafer with a flat edge hereinafter in the present embodiment.

The first shaft gear 130 is disposed on a side surface 110b of the base 110. The power unit 140 is assembled to a top of the base 110. The first shaft gear 130 is connected with the power unit 140. Additionally, the power unit 140 of the present embodiment includes a motor 142 and a power supply device 144 (which is a battery, for example). The motor 142 is connected with the first shaft gear 130, and the power supply device 144 is electrically connected with the motor 142 and drives the motor 142 to drive the first shaft gear 130.

Figure 4:
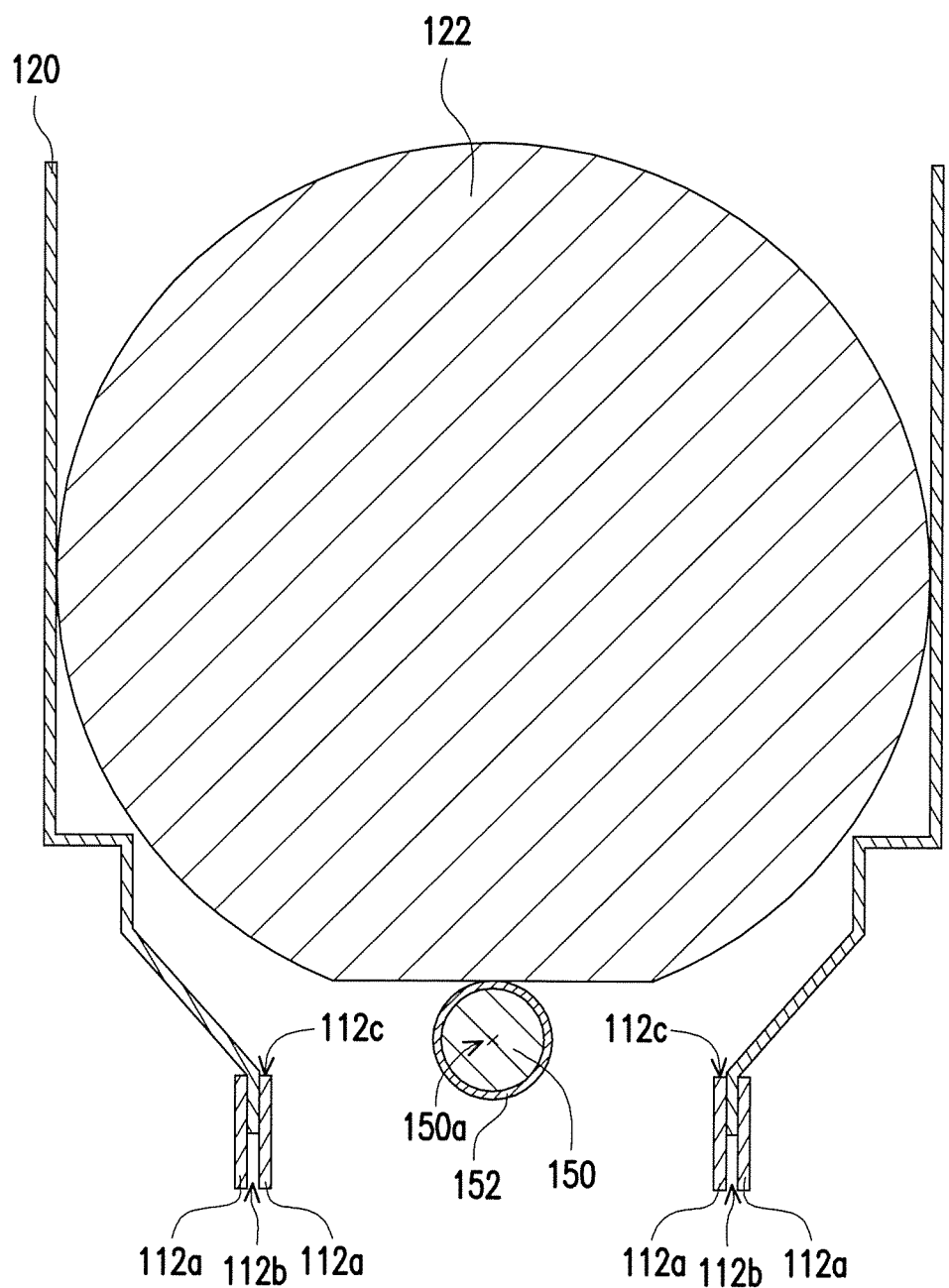
FIG. 4 is a cross-sectional view of the base and the carrying device depicted in FIG. 1 when being assembled together.

FIG. 4 is a cross-sectional view of the base and the carrying device depicted in FIG. 1 when being assembled together. Referring to FIG. 1, FIG. 2 and FIG. 4, the roller 150 is located under the carrying device 120 and supports an edge of the wafer 122. The second shaft gear 160 is disposed on the side surface 110b of the base 110 and connected with the roller 150. The driving assembly 170 is connected between the first shaft gear 130 and the second shaft gear 160. When the power supply device 144 transmits a power to the motor 142, the motor 142 enables the first shaft gear 130 and the driving assembly 170 to rotate, and the second shaft gear 160 rotates to drive the roller 150 rotate about a rotation center 150a. Thus, the wafer 122 rotates. Due to the wafer 122 rotating, surfaces of the wafer 122, either during a wafer cleaning process or during a wafer electroless plating process, are evenly dipped in a cleaning fluid (not shown), or no gas (e.g., hydrogen) remains on the surfaces of the wafer 122, such that the wafer 122 has good appearance or has an evenly plated layer to improve a yield rate of the wafer 122 as being processed. Thereby, the yield rate of the wafer 122 is improved to save time for subsequent processing, so as to reduce fabrication cost of the wafer 122.

The difference between scenarios of the wafer cleaning equipment and the wafer electroless plating equipment with the use and without the use of the wafer rotating apparatus 100 of the invention.

Table 1 is a comparison table of a control group and an experimental group. In Table 1, data of the control group is obtained in a scenario that the wafer rotating apparatus 100 of the invention is not used, while data of the experimental group is obtained in a scenario that the wafer rotating apparatus 100 of the invention is used. According to Table 1, in both the wafer cleaning process and the wafer electroless plating process, as the wafer rotating apparatus 100 of the invention is used, the appearance of the wafer may achieve a good condition, plated layer thereof may cover the surfaces of the wafer, and the yield rate of the wafer 122 may be greater than 97%.

TABLE 1

Comparison table of Control group and Experimental group

| Cleaning | Number of Inputs | Shadows | Yield Loss Rate of Shadows | Good Products | Yield Loss Rate | Yield Rate |
|---|---|---|---|---|---|---|
| Control Group | 91 | 51 | 56.0% | 40 | 56.00% | 44.00% |
| Experimental Group | 91 | 2 | 2.20% | 89 | 2.20% | 97.80% |

| Electroless Plating | Number of Inputs | Hue Unevenness | Hue Unevenness Rate | Good Products | Yield Loss Rate | Yield Rate |
|---|---|---|---|---|---|---|
| Control Group | 1000 | 221 | 22.1% | 779 | 22.1% | 77.9% |
| Experimental Group | 1,579,360 | 762 | 0.05% | 1,578,598 | 0.05% | 99.95% |

Referring to FIG. 4, in order to increase a friction force between the roller 150 and the edge of the wafer 122 to ensure that the wafer 122 is capable of successfully rotating, the roller 150 of the present embodiment may have a wrapping layer 152 which is made of rubber. Additionally, in another embodiment, a material of the wrapping layer 152 of the roller 150 is marprene. Moreover, a material of the roller 150 of the present embodiment may be polyaryletherketone (PEEK). Thereby, resistance of the roller 150 to high temperature and chemistry may be increased.

Referring to FIG. 2 and FIG. 4, the base 110 further has a fixing portion 112. The fixing portion 112 is disposed in the accommodating space 110a and includes a plurality of limiting walls 112a and a limiting slot 112b between each two adjacent limiting walls 112a, and the limiting slots 112b connect with the accommodating space 110a, such that the wafer 122 fully contacts a wafer processing fluid. Opposite sides of the bottom of the carrying device 120 are disposed in the limiting slot 112b to limit the carrying device 120 from moving. Thereby, incapability of the wafer 122 fully reacting with the wafer processing fluid due to the moving of the carrying device 120 is prevented. It should be noted that the number of the limiting slots 112b is illustrated as two in the present embodiment; however, in other embodiments, the number of the limiting slots 112b may be corresponding to the number of the carrying devices 120 to be four. A user may adjust the number of the limiting slots 122b and the number of the carrying devices 120 based on actual requirements.

Figure 5:
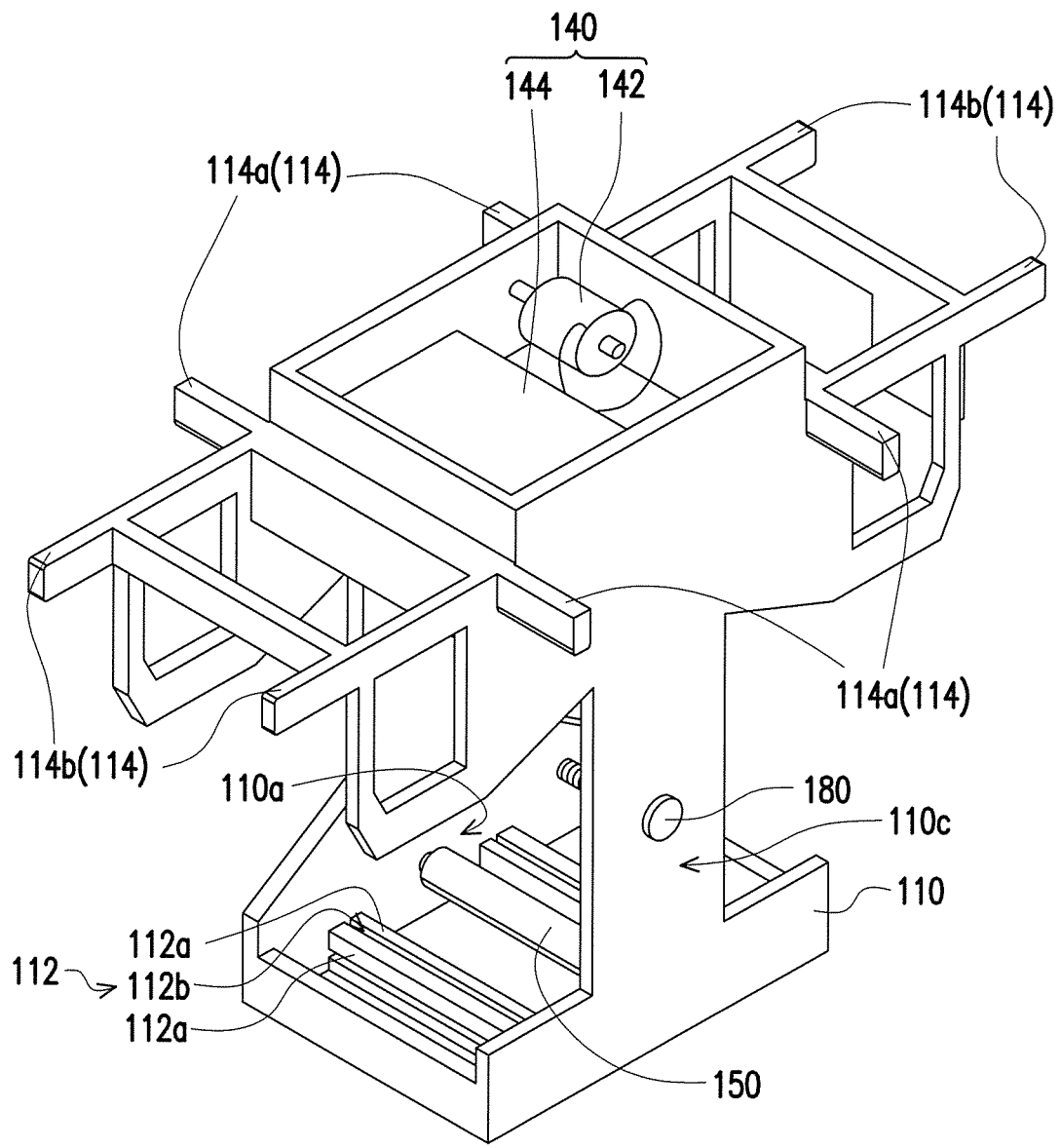
FIG. 5 is another perspective view of the wafer rotating apparatus depicted in FIG. 1 after the carrying device is removed.

FIG. 5 is another perspective view of the wafer rotating apparatus depicted in FIG. 1 after the carrying device is removed. Referring to FIG. 2, FIG. 4 and FIG. 5, in the present embodiment, the wafer rotating apparatus 100 further includes a limiting pillar 180 disposed on another side surface 110c of the base 110. The limiting pillar 180 protrudes from the another side surface 110c of the base 110 into the accommodating space 110a and is located above the top of the carrying device 120. Specifically, the limiting pillar 180 of the present embodiment may be a screw, and a front end of the limiting pillar 180 is screwed into the accommodating space 110a after the carrying device 120 is installed in the accommodating space 110a, such that the carrying device 120 is limited from wobbling. This way also achieves preventing incapability of the wafer 122 fully reacting with the wafer processing fluid due to the moving of the carrying device 120.

In addition, a height of a top surface 112c of each of the limiting walls 112a of the present embodiment is lower than a height of the rotation center 150a of the roller 150. Thereby, the roller 150 is supported by the edge of the wafer 122 to surely drive the wafer 122 to rotate.

The driving assembly 170 of the present embodiment includes a first gear 172 engaged with the first shaft gear 130, a second gear 174 engaged with the second shaft gear 160, and a third gear 176 engaged between the first gear 172 and the second gear 174. In this way, a motive force provided by the motor 142 of the power unit 140 is transmitted on the side surface 110b of the base 110 to reduce the space required for the motive force transmission. Thus, the wafer rotating apparatus 100 has a flexible element disposition space. In another embodiment, the driving assembly 170 is a belt surrounding the first shaft gear 130 and the second shaft gear 160.

Referring to FIG. 1, FIG. 2 and FIG. 5, the base 110 further has a handheld portion 114. The base 110 is movable disposed in the wafer processing equipment through the handheld portion 114. Specifically, the handheld portion 114 of the present embodiment includes a plurality of first cantilevers 114a and a plurality of second cantilevers 114b. The first cantilevers 114a and the second cantilevers 114b respectively protrudes toward the outsides of the base 110, and an extension direction of the first cantilevers 114a is not parallel to an extension direction of the second cantilevers 114b. After the carrying device 120 is installed on the base 110, the user may hang the wafer rotating apparatus 100 in the wafer processing equipment by using the assembly of the first cantilevers 114a and the second cantilevers 114b or the assembly of the first cantilevers 114a and the second cantilevers 114b. Thereby, after the wafer 122 is processed, or when abnormality occurs during the processing of the wafer, the user may removes the wafer rotating apparatus 100 out of the wafer processing equipment conveniently.

Figure 6:
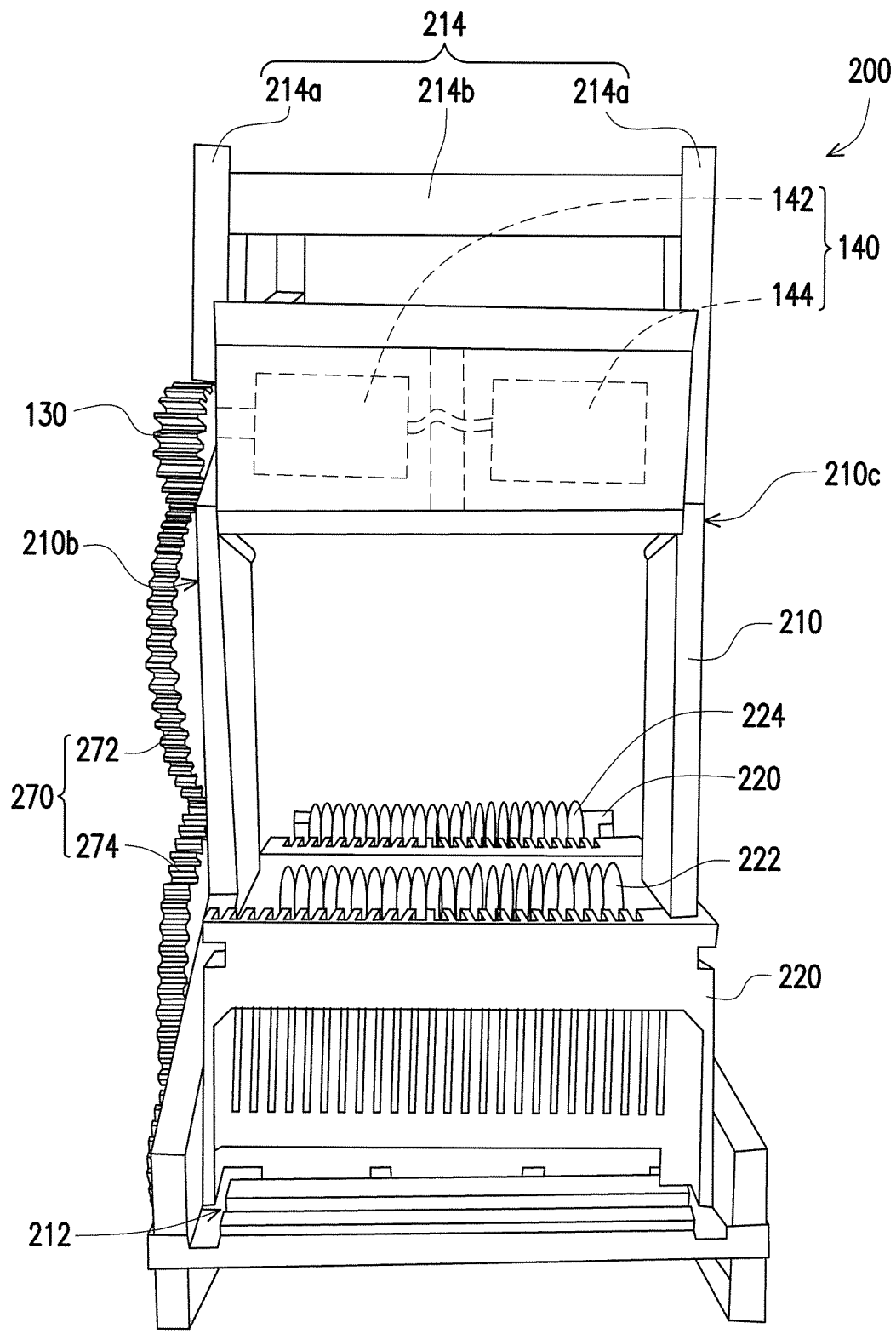
FIG. 6 is a perspective view illustrating a wafer rotating apparatus according to another embodiment of the invention.
Figure 7:
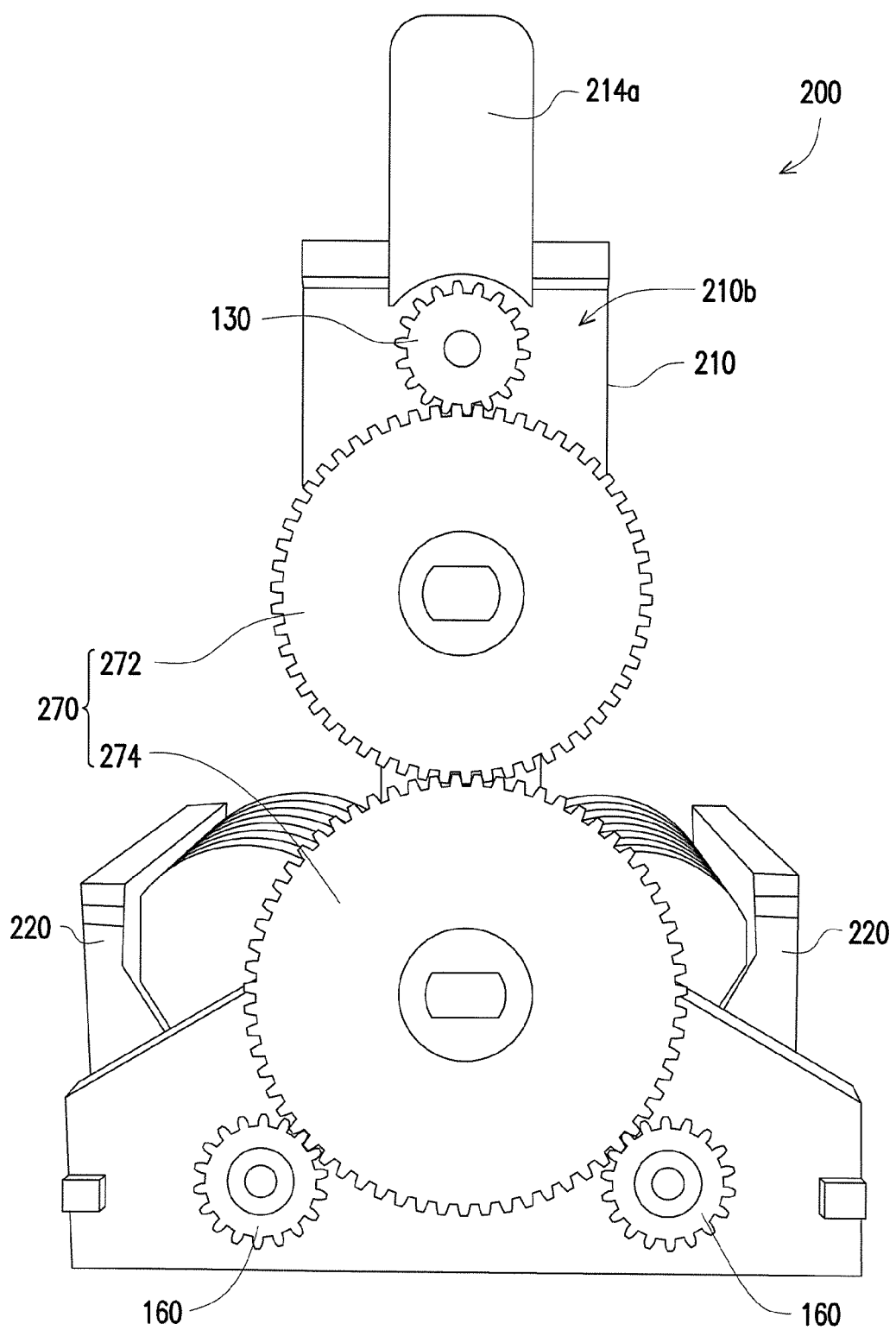
FIG. 7 is a left side view illustrating the wafer rotating apparatus depicted in FIG. 6.

FIG. 6 is a perspective view illustrating a wafer rotating apparatus according to another embodiment of the invention. FIG. 7 is a left side view illustrating the wafer rotating apparatus depicted in FIG. 6. Referring to FIG. 6 and FIG. 7, a wafer rotating apparatus 200 of the present embodiment is similar to the wafer rotating apparatus 100 illustrated in FIG. 1, and thus, the same or similar symbols represent the same or similar elements, which will not be repeatedly described hereinafter. In the present embodiment, a driving assembly 270 includes a first gear 272 and a second gear 274, and the number of the second shaft gears 160 is two. In the meantime, the number of the rollers 150 (referring to FIG. 9) is also two in correspondence to the two second shaft gears 160, and the two second shaft gears 160 are engaged with the second gear 274. In other words, two carrying devices 220 may be installed in the wafer rotating apparatus 200 of the present embodiment, so as to simultaneously rotate the wafers 222 and 224. Additionally, the driving assembly 270 of the present embodiment may be a belt and surrounds the first shaft gear 130 and the two second shaft gears 160.

Figure 8:
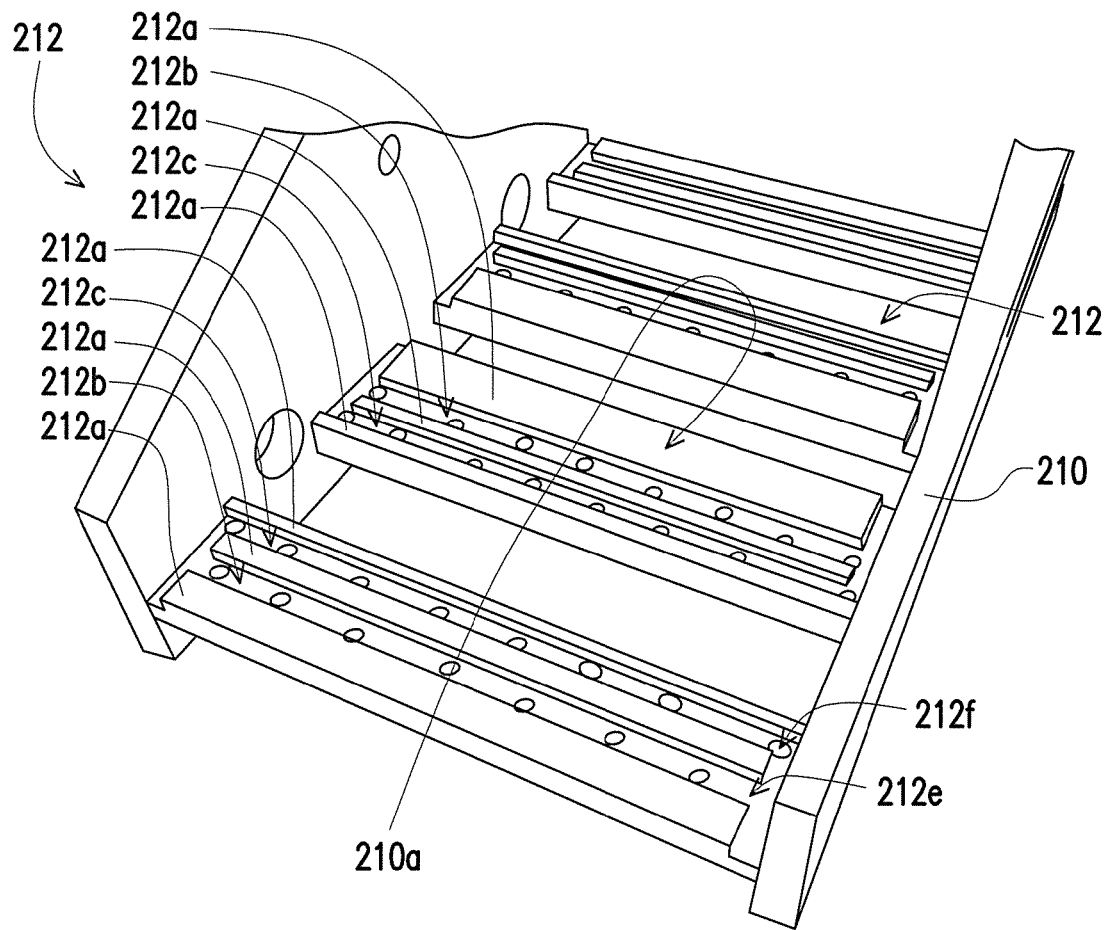
FIG. 8 is a perspective view illustrating part of the base depicted in FIG. 6.
Figure 9:
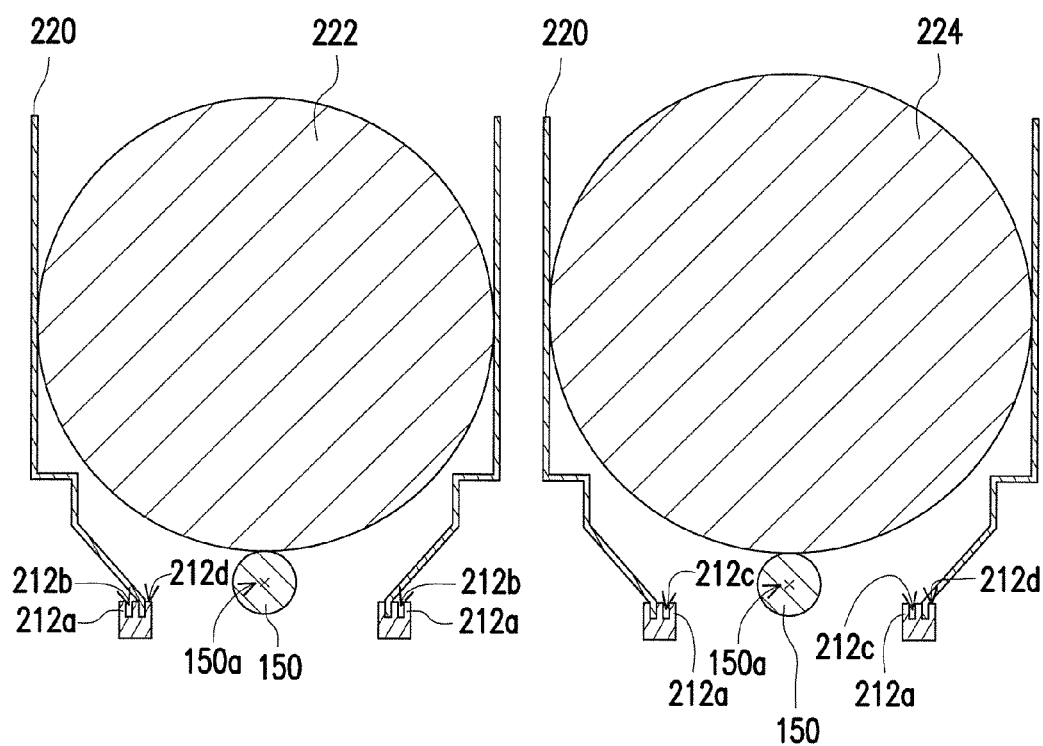
FIG. 9 is a cross-sectional view of the base and the carrying device depicted in FIG. 6 when being assembled together.

FIG. 8 is a perspective view illustrating part of the base depicted in FIG. 6. FIG. 9 is a cross-sectional view of the base and the carrying device depicted in FIG. 6 when being assembled together. Referring to FIG. 6, FIG. 8 and FIG. 9, in the present embodiment, a base 210 includes a fixing portion 212 disposed in an accommodating space 210a. The fixing portion 212 includes a plurality of limiting walls 212a and limiting slots 212b and 212c, each of which is located between each two adjacent limiting walls 212a. The limiting slots 212b and 212c are recessed from the top surfaces of the limiting walls 212a to form a plurality of floors 212e. Each floor 212e has a plurality of through holes 212f connecting with the accommodating space 210a and the limiting slots 212b and 212c. Opposite sides of the bottom of the carrying device 220 are disposed in two limiting slots 212b, or the opposite sides of the bottom of the carrying device 220 are disposed in another two limiting slots 212c, and the two carrying devices 220 contact the floors 212e to limit the wafers 222 and 224 from moving. Thus, the fixing portion 212 of the base 210 of the present embodiment and the fixing portion 112 of the base 110 illustrated in FIG. 1 are different in the fixing portion 212 of the present embodiment being capable of simultaneously limiting the carrying device 220 containing the two wafers 222 and 224 with different sizes (e.g., a wafer having a size of 3 inches and a wafer having a size of 4 inches) from moving or simultaneously limiting the carrying device 220 containing the two wafers 222 and 224 with the same size from moving.

Additionally, the through holes 212f and the limiting slots 212b and 212c connecting with the accommodating space 210a may facilitate the wafers 222 and 224 in fully contacting the wafer processing fluid. Additionally, the height of the top surface 212d of each of the limiting walls 212a of the present embodiment is lower than the height of the rotation center 150a of the roller 150. Thereby, the roller 150 is supported by the edges of the wafers 222 and 224, so as to surely drive the wafers 222 and 224 to rotate.

Referring to FIG. 6 and FIG. 7, the base 210 of the present embodiment further includes a handheld portion 214. The handheld portion 214 includes two first frames 214a and a second frame 214b. The two first frames 214a are respectively disposed on a side surface 210b and another side surface 210c of the base 210, and the second frame 214b is vertically connected between two first frames 214a. Thereby, the user may put or hang the wafer rotating apparatus 200 in the wafer processing equipment conveniently.

To summarize, in the invention, the wafer can be rotated through the shaft gears, the driving assembly and the roller, such that the wafer surfaces can have good appearance, or no gas will remain on the wafer surfaces. Thereby, the yield rate of the wafer is improved to save time for subsequent processing, so as to reduce fabrication cost of the wafer. Moreover, when the roller has the wrapping layer, and the wrapping layer is made of rubber or marprene, the friction force between the roller and the edge of the wafer can be increased, which facilitates in rotating the wafer. In addition, when the base has the fixing portion, the carrying device can be prevented from moving and the risk that the wafer is incapable of reacting with the wafer processing fluid can be mitigated. Further, when the base has the handheld portion, the user can move the wafer rotating apparatus in or out of the wafer processing equipment.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A wafer rotating apparatus, applied in a wafer processing equipment, the wafer rotating apparatus comprising:
   a base, having an accommodating space;
   a carrying device, disposed in the accommodating space and used to accommodate a wafer;
   a first shaft gear, disposed on a side surface of the base;
   a power unit, assembled to a top of the base, wherein the first shaft gear is connected to the power unit;
   a roller, located under the carrying device and supporting an edge of the wafer;
   a second shaft gear, disposed on the side surface and connected to the roller; and
   a driving assembly, connected between the first shaft gear and the second shaft gear, wherein when the power unit provides a power to enable the first shaft gear and the driving assembly to rotate, the second shaft gear rotates to drive the roller to rotate, so as to rotate the wafer.

2. The wafer rotating apparatus according to claim 1, wherein the roller has a wrapping layer wrapping around the roller to increase friction between the roller and the edge of the wafer.

3. The wafer rotating apparatus according to claim 2, wherein a material of the wrapping layer is rubber.

4. The wafer rotating apparatus according to claim 2, wherein a material of the wrapping layer is marprene.

5. The wafer rotating apparatus according to claim 1, wherein the base further has a fixing portion, the fixing portion is disposed in the accommodating space and comprises a plurality of limiting walls and a limiting slot between each two adjacent limiting walls, the limiting slots connect with the accommodating space, and opposite sides of a bottom of the carrying device are disposed in the limiting slots to limit the carrying device from moving.

6. The wafer rotating apparatus according to claim 5, wherein a height of a top surface of each of the limiting walls is lower than a height of a rotation center of the roller.

7. The wafer rotating apparatus according to claim 1, wherein the base further has a fixing portion, the fixing portion is disposed in the accommodating space and comprises a plurality of limiting walls and a limiting slot between each two adjacent limiting walls, the limiting slots are recessed from the top surfaces of the limiting walls to form a plurality of floors, each of the floors has a plurality of through holes connecting with the accommodating space and the limiting slots, and opposite sides of a bottom of the carrying device are disposed in the limiting slots and contact the floors to limit the carrying device from moving.

8. The wafer rotating apparatus according to claim 7, wherein a height of a top surface of each of the limiting walls is lower than a height of a rotation center of the roller.

9. The wafer rotating apparatus according to claim 1, wherein the driving assembly is gear chain set, the gear chain set comprises a plurality of gears, and the gears are engaged between the first shaft gear and the second shaft gear.

10. The wafer rotating apparatus according to claim 1, wherein the driving assembly is a belt, and the belt surrounds the first shaft gear and the second shaft gear.

11. The wafer rotating apparatus according to claim 1, wherein the base further has a handheld portion, and the base is movably disposed in the wafer processing equipment through the handheld portion.

12. The wafer rotating apparatus according to claim 11, wherein the handheld portion has at least a pair of cantilevers, and the cantilevers respectively protrude toward the outsides of the base.

13. The wafer rotating apparatus according to claim 11, wherein the handheld portion has two first frames and a second frame, the two first frames are respectively disposed on the side surface and another side surface of the base, and the second frame is vertically connected between the two first frames.

14. The wafer rotating apparatus according to claim 1, wherein the power unit comprises:
   a motor, connected with the first shaft gear; and
   a power supply device, electrically connected with and driving the motor to drive the first shaft gear to rotate.

15. The wafer rotating apparatus according to claim 1, further comprising:
   a limiting pillar, disposed on another side surface of the base, protruding from the another side surface into the accommodating space and located above the top of the carrying device to limit the carrying device from wobbling.

* * * * *